United States Patent
Curcio, Jr. et al.

(10) Patent No.: US 7,266,744 B2
(45) Date of Patent: Sep. 4, 2007

(54) APPLICATION SPECIFIC INTEGRATED CIRCUIT WITH INTERNAL TESTING

(75) Inventors: Joseph A. Curcio, Jr., Folsom, CA (US); John A. Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 262 days.

(21) Appl. No.: 11/011,232

(22) Filed: Dec. 14, 2004

(65) Prior Publication Data

US 2006/0156148 A1    Jul. 13, 2006

(51) Int. Cl.
*G01R 31/28* (2006.01)
*G06F 11/00* (2006.01)

(52) U.S. Cl. ..................... 714/731; 714/744

(58) Field of Classification Search ................ 714/700, 714/731
See application file for complete search history.

(56) References Cited

U.S. PATENT DOCUMENTS

| | | | | |
|---|---|---|---|---|
| 5,369,640 A * | 11/1994 | Watson et al. | ............... | 714/700 |
| 5,442,774 A | 8/1995 | Pickup et al. | | |
| 5,457,400 A | 10/1995 | Ahmad et al. | | |
| 5,633,803 A | 5/1997 | Silve et al. | | |
| 5,640,337 A | 6/1997 | Huang et al. | | |
| 5,703,788 A | 12/1997 | Shei et al. | | |
| 5,938,779 A | 8/1999 | Preston | | |
| 6,075,389 A | 6/2000 | Umemoto et al. | | |
| 6,075,832 A | 6/2000 | Geannopoulos et al. | | |
| 6,199,031 B1 | 3/2001 | Challier et al. | | |
| 6,338,158 B1 | 1/2002 | Payne | | |
| 6,539,508 B1 | 3/2003 | Patrie et al. | | |
| 6,564,329 B1 | 5/2003 | Cheung et al. | | |
| 6,636,979 B1 * | 10/2003 | Reddy et al. | ............... | 713/503 |
| 6,768,333 B1 | 7/2004 | Kao et al. | | |
| 6,768,694 B2 | 7/2004 | Anand et al. | | |
| 2005/0154552 A1 * | 7/2005 | Stroud et al. | ............... | 702/120 |
| 2005/0193280 A1 * | 9/2005 | Schubert et al. | ............... | 714/47 |
| 2006/0085708 A1 * | 4/2006 | Howard et al. | ............. | 714/726 |
| 2006/0150046 A1 * | 7/2006 | Ong | ......................... | 714/738 |

OTHER PUBLICATIONS

Sarrica, Giuseppe and Kessler, Brian, Theory And Implementation Of LSSD Scan Ring & STUMPS Channel Test And Diagnosis, Sep. 28-30, 1992, Electronics Manufacturing Technology Symposium, 1992., Thirteenth IEEE/CHMT International, pp. 195-200.*

* cited by examiner

*Primary Examiner*—Guy Lamarre
*Assistant Examiner*—Saqib Siddiqui

(57) ABSTRACT

Application specific integrated circuits (ASICs) and methods are provided which allow for internal testing of an ASIC. One ASIC embodiment includes a processor on the ASIC. A memory is coupled to the processor. A test circuit is integrated on the ASIC and coupled to the processor to perform testing internal to the ASIC, the test circuit having an input to receive signals from the processor. The processor can read an output of the test circuit to determine a performance speed of the ASIC.

23 Claims, 3 Drawing Sheets

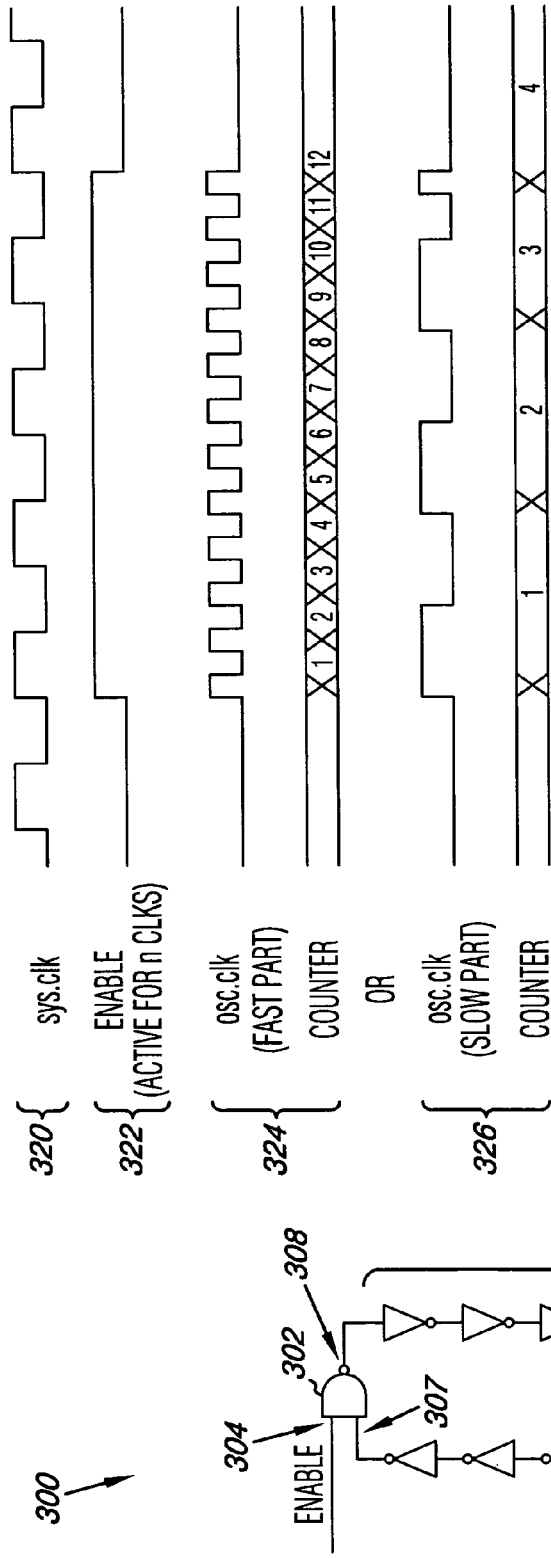
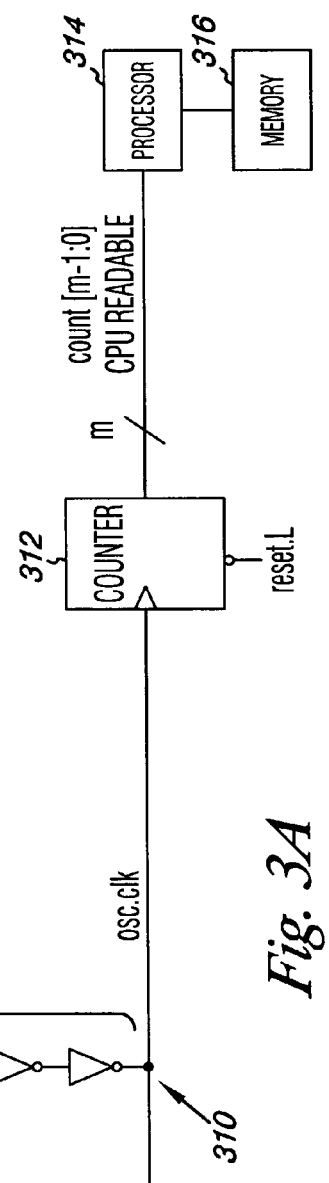
Fig. 3A
Fig. 3B

APPLICATION SPECIFIC INTEGRATED CIRCUIT WITH INTERNAL TESTING

Despite heavy investigation and much simulation, modeling, and industry experience, application specific integrated circuits (ASICs) do not always behave as intended. One issue facing ASICs includes changes in performance of the chip because of variations in the manufacturing process. Similarly, changes in performance can be caused because the sub micron transistor models provided for the ASIC design do not match the actual transistor performance once the ASIC is manufactured.

In addition to manufacturing process issues, the environment in which an ASIC is being used, including voltage (power) and temperature conditions may affect the performance of the ASIC. Thus, process, voltage, and temperature (PVT) conditions each contribute to impact an ASIC's performance.

ASICs are growing in size and density of transistors contained thereon, e.g., 2 million gates or more. Today, ASIC manufacturers may provide relative process information (e.g., fast, slow, nominal) on a specific need basis. To do so, the manufacturer may use speed circuits in between the wafer die (e.g., in the scribe line area) to add process measurement data. Also, manufacturers may use a test wafer flowing through the process to sample the aggregate performance of all the transistor doping steps involved. For a fee, the customer can get the manufacturer to measure the process circuits and stamp a relative speed number onto the package of the chip.

Measuring the process circuits can be expensive and time consuming. Moreover, markings on chips can be difficult to read in the ASIC real time use environment and may not address all of the PVT conditions present with the ASIC's end use environment.

BRIEF DESCRIPTION OF THE DRAWINGS

FIG. 3A illustrates another test circuit embodiment as can be included on an ASIC such as those shown in FIG. 1.

FIG. 3B illustrates timing chart embodiments of clock signals and counter points associated with the operation of the test circuit embodiment of FIG. 3A.

DETAILED DESCRIPTION

Embodiments of the invention cover ASICs and methods which allow for internal testing of an ASIC. One ASIC embodiment includes a processor on the ASIC. A memory is coupled to the processor. A test circuit is integrated on the ASIC and coupled to the processor to perform testing internal to the ASIC, the test circuit having a clock input and an input to receive signals from the processor. In one embodiment, the processor can read an output of the test circuit to determine how far a transition initiated by the processor has propogated through the test circuit in a particular period of time in reference to temperature and process information.

In another embodiment, the processor can read a counter output clocked by an oscillator formed from a number of gates connected in series. The number of gates provide an odd number of inversions to a signal received from an output of an enable gate. The processor can execute instructions to read a count on the counter after a particular period of time, the count being indicative of a frequency of the oscillator, and can execute instructions to produce a ratio of the oscillator frequency to a frequency of a system clock in order to determine a speed of the ASIC.

The test circuit can facilitate direct and instant measurement of the chip performance. Speed, performance, and process information can be useful during early debug and chip characterization. Likewise, it can also be used at anytime during the ASICs life to tune parameters for improved chip performance or error tolerance or debugging analysis. For example, if an ASIC has a problem that is not a functional issue, but is a timing, noise, or power related issue, the test circuit can help determine if the problem is occurring only on certain manufacturing corners, i.e., particular steps in the manufacturing process.

If a problem is only occurring in a specific area of the manufacturing process, the test circuit can be used to "sort" the early parts for ones that should not exhibit the problem. In various embodiments, if a problem is occurring in an end user, e.g., customer environment, the test circuit can provide helpful information to adjust the operating environment to improve performance. For example, a problem which only occurs in a slow process and high temperature could indicate a speed related issue in which case the clock speed on the ASIC may be adjusted.

Figure 1:
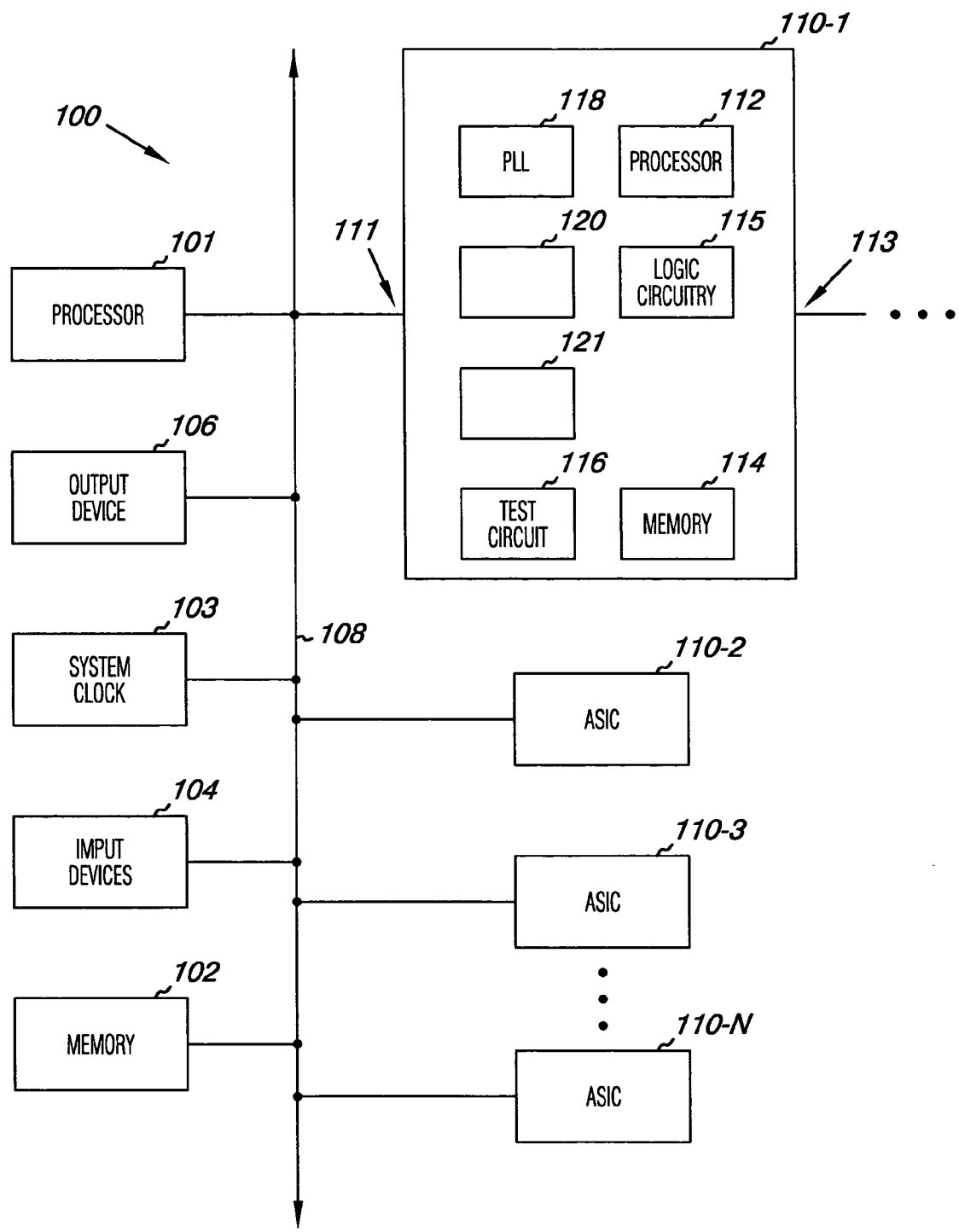
FIG. 1 illustrates a block diagram for a computing system environment including a number of ASICs.

FIG. 1 illustrates a block diagram for a computing system environment including a number of ASICs. As shown in FIG. 1 a computing system can include one or more system processors 101, one or more memories 102, one or more system clocks 103, one or more input devices 104, and one or more output devices 106. Such components can be coupled together via a system bus 108. One of ordinary skill in the art will appreciate the variety and types of such components as may be included in a computing system. More detail is not provided here so as not to obscure the embodiments of this disclosure.

As shown in the embodiment of FIG. 1, a number of application specific integrated circuits (ASICs), 110-1, 110-2, 110-3, . . . , 110-N, may be included in the computing system 100. According to various embodiments and as illustrated in 110-1, a given ASIC can include an integrated, or on chip, processor 112, memory local to the ASIC 114, logic circuitry for performing particular application functions 115, all coupled between one or more inputs 111 and outputs 113 to the ASIC. As shown in the embodiment of FIG. 1 and described in more detail below, the ASIC 110-1 illustrates an internal test circuit 116 located thereon. The test circuit 116 is provided to measure performance of the ASIC 110-1 for real time measurements in the field of ASIC use or otherwise. ASICs 110-2, 110-3, . . . , 110-N, can include a similar circuit configuration to that discussed in connection with ASIC 110-1. The designator "N" is used to indicate that a number of ASICs may be included with a given computing system 100. Embodiments, however, are not limited to the example illustration provided in FIG. 1.

In the embodiment of FIG. 1, a processor 112 is provided directly on the ASIC 110-1 in addition to processors 101 located elsewhere in the computing system 100. According to various embodiments the processor 112 located on the ASIC 110-1 can facilitate direct and instant measurement of the chip performance. As one of skill in the art will appreciate from reading this disclosure, the processor 112 can execute a variety of instructions to gather ASIC 110-1 speed, performance, and process information which is useful to chip debug and characterization. In various embodiments the processor can further execute instructions to adjust the performance of the ASIC, e.g., increase and/or decrease a clock frequency on the ASIC using a phase lock loop (PLL) 118. In various embodiments the processor can execute instructions to gather temperature information on the environment of ASIC use such as through a thermal diode 120 located on ASIC 110-1. In various embodiments the processor can execute instructions to gather operating voltage information, etc., such as through the use of a voltage analog to digital (A/D) converter, e.g., 121 located on ASIC 110-1. The processor 112 can further execute instructions to dynamically adjust the performance of the ASIC by increasing and/or decreasing the operating voltage of the ASIC while in use to aid the ASIC in running faster or slower, respectively. The processor 112 can, in some embodiments, further execute instructions to cool the ASIC by operating a variable fan (not shown) which could aid to improve the speed of the ASIC. Embodiments for adjusting the performance of the ASIC are not limited to these examples.

Figure 2:
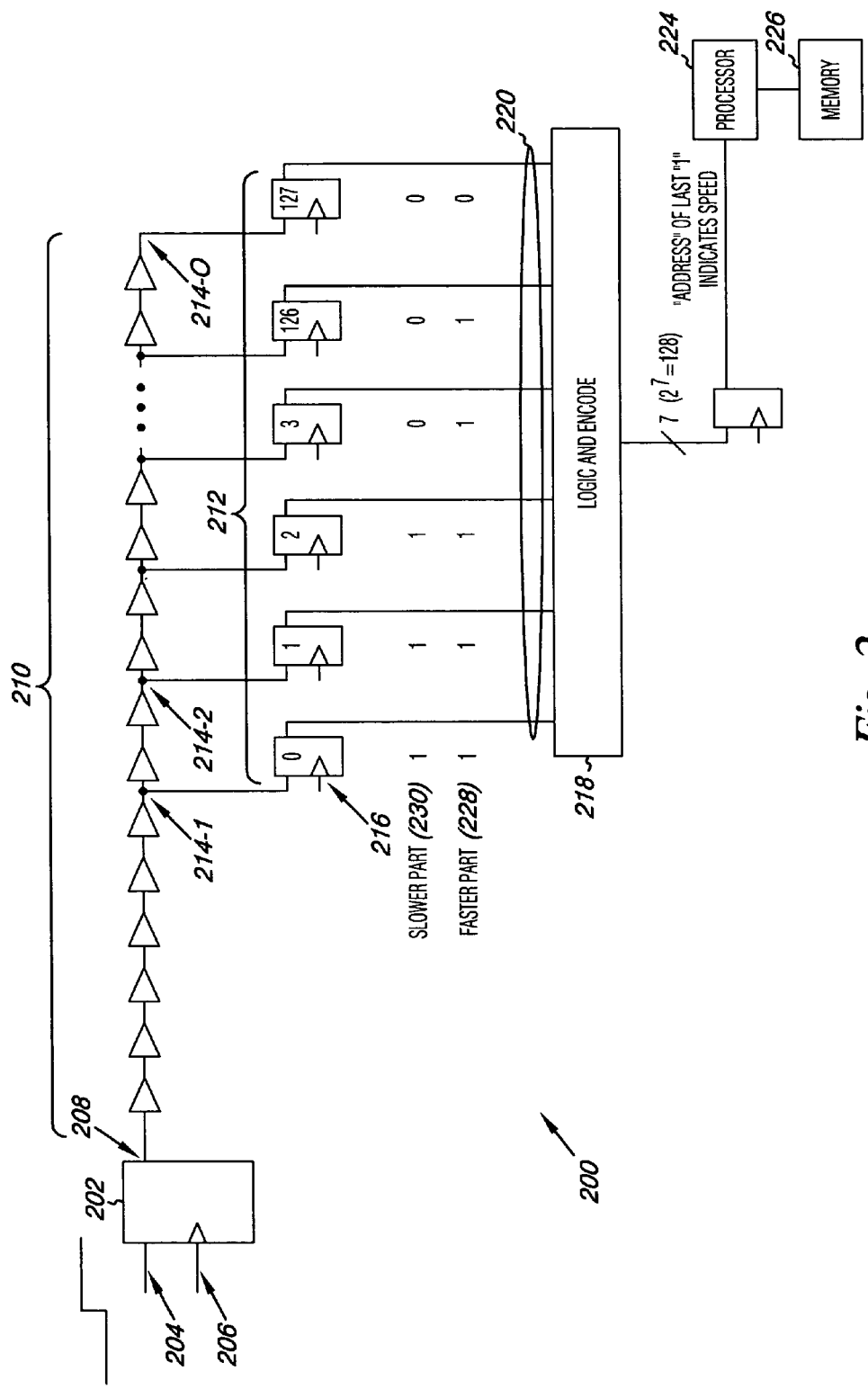
FIG. 2 illustrates a test circuit embodiment as can be included on an ASIC such as those shown in FIG. 1.

FIG. 2 illustrates a test circuit embodiment 200 as can be included on an ASIC 110-1 such as those shown in FIG. 1, e.g., test circuit 116. As shown in FIG. 2, the test circuit includes a first flip flop 202 having inputs 204 and 206 to receive processor signals and clock signals, respectively. In various embodiments a processor on the computing system, e.g., processor 101 in FIG. 1, can provide an input signal, or first signal, to test circuit input 204 via an input to the ASIC, e.g., via 111. In certain embodiments a processor is provided on the ASIC itself, such as 224 in FIG. 2, and can provide an input signal to test circuit input 204. As shown in FIG. 2, the processor can provide a first signal to the first flip flop 202 to initiate a transition on an output 208 of the first flip flop 202 in combination with a first clock signal received to clock input 206. The processor, e.g., 224, can execute instructions to provide the first signal to input 204 and initiate a transition on the output 208 of the first flip flop 202 at either a rising (leading) edge, falling (trailing) edge or when the clock pulse is at logic 1, according to the design of the circuit. Thus, too, the processor, e.g., 224, can initiate a signal state transition of a "0" to a "1" on the output 208 of the first flip flop, or can initiate a signal state transition of a "1" to a "0".

As shown in FIG. 2, the transition occurring at the output 208 of the first flip flop 202 is propogated through a number of gates 210. As the reader will appreciate, the test circuit 200 will not transition or be active unless the processor, e.g., 224, initiates the transition on the first flip flop 202 feeding the chain of gates 210. In one example embodiment the number of gates 210 are inverters. In one example embodiment the number of gates 210 are buffers. And, in one example embodiment the number of gates are exclusive OR type gates. Embodiments, however, are not limited to these examples. Embodiments are also not limited to the number of gates implemented in the serial chain nor a particular drive strength of the gates, etc. A number of second flip flops 212 are connected to different points 214-1, 214-2, . . . , 214-O along the signal path of the number of gates 210 connected in series. In the embodiment of FIG. 2, 128 sample flip flops are illustrated. However, the embodiments are not limited to this example and the designator "O" is used to represent that another number of second flip flops 212 can be chosen as suited to a particular design implementation. Each one of the number of second flip flops 212 has an input connected to a different point, e.g., 214-1, 214-2, . . . , 214-O, along the signal path. Each one of the number of second flip flops 212 also includes a clock input, e.g., 216, to receive clock signals. A logic circuit 218 is provided with the test circuit. The logic circuit 218 includes a number of inputs (shown collectively as 220). Each input, among inputs 220, is respectively coupled to receive a signal output from one of the number of second flip flops 212.

According to the embodiment shown in FIG. 2, at a second clock signal, received to the clock input 216 of the number of second flip flops 212, will take a signal state, e.g., "1" or "0", from the number of different points, 214-1, 214-2, . . . , 214-O, and provide the signal output from the number of second flip flops 212 to the inputs 220 of the logic circuit 218. As the reader will appreciate, the number of gates 210 should form a long enough chain so that in a fast signal scenario the transition does not propagate through the entire chain of the number of gates 210 before the signal state is read at the number of different points 214-1, 214-2, . . . , 214-O.

As shown in the embodiment of FIG. 2, the logic circuit can encode an address indicative of how far a transition, e.g., "1" to "0", or "0" to "1", propogated through the number of gates 210 in a particular period of time, i.e., indicative of the operational speed on a particular portion of the ASIC according to a set of operating conditions such as temperature, etc. That is, the logic circuit can find a last "1" signal state as received from the number of second flip flops 212 to the inputs 220. In the example illustration of FIG. 2, having 128 sample flip flops 212, the logic circuit 218 can encode an address of the last "1" signal state output from the second flip flops 212 to the logic circuit 218 as a serial string of seven (7) bits. One of ordinary skill in the art will appreciate the manner in which the logic circuit 218 can encode the address of the last "1" signal state. As further shown in FIG. 2, the logic circuit 218 can communicate the address, indicative of the speed, to the processor 224.

The processor 224 can execute instructions to read the address and can execute to compare the address to a look up table in a memory 226 to determine the performance speed of the ASIC. To note, if the gates 210 are fast gates according to a particular manufacturing design rule or specification, then the signal state taken from the number of different points, 214-1, 214-2, . . . , 214-O, can be spaced to a particular number of gates, e.g., every "M" gates (M designating the particular number of gates between sampling points 214-1, 214-2, . . . , 214-O). FIG. 2 provides an illustrative example for the "1" signal state output propagation from the number of second flip flops 212 to the logic circuit 218 in a slower ASIC part scenario 228 and a faster ASIC part scenario 230. To further note, the circuit embodiment of FIG. 2 will involve a careful layout of the entire set of the chain of gates 210 and the sampling flip flops 212 to ensure that loading on the chain of gates 210 is controlled. The reader will appreciate that more than one test circuit, herein described, can be included on a given ASIC.

As the reader will further appreciate, the number of gates 210 can include gates of a particular type that are used in other circuit paths on the ASIC. For example, if particular circuit paths on the ASIC used eight input multiplexers, then the number of gates 210 could include eight input multiplexers to retrieve information relevant to the actual gates used in the ASIC design. Additionally, in some embodiments, different chains of the number of gates 210 can be included in the test circuit and read independently to provide an added level of detail, e.g. to measure the performance associated with particular portions, particular inputs, and/or particular gate types on the ASIC. Thus, the test circuit embodiments described herein, can provide a speed performance measurement, e.g., average delay indication or delay measurement, relevant to a particular gate type on the ASIC rather than an average delay per many different gate types.

For example, one particular chain of the number of gates 210 can be included to measure speed performance associated with inverters, another for two input AND gate types, another for two input OR gate types, etc.

FIG. 3A illustrates another test circuit embodiment 300 as can be included on an ASIC, e.g., 110-1, such as those shown in FIG. 1, with an associated timing chart (FIG. 3B) of clock signals and counter values within the operation of the test circuit 300. As shown in FIG. 3, the test circuit includes a first gate 302 which has a first input 304 to receive an enable signal. As discussed above in connection with FIG. 2's embodiment a processor, such as computing system processor 101 in FIG. 1, can provide the enable signal, or first signal, to the first input 304 via an input to the ASIC, e.g., via 111. However, in certain embodiments a processor is provided on the ASIC itself, such as 314 in FIG. 3, and can provide the enable signal to the first input 304. In the embodiment of FIG. 3 a NAND gate is illustrated as the first gate 302. A number of second gates 306 are connected in series to receive a signal from an output 308 of the first gate 302. As shown in FIG. 3, the number of second gates 306 provide an odd number of inversions to the signal received from the output 208 of the first gate 302 and provide a second input 307 to the first gate 302 to form an oscillator.

An output 310 of one of the number of second gates 306 is coupled to a counter 312 and increments the counter 312 according a frequency of the oscillator 306. The counter 312 is coupled to the processor, e.g., processor 314. As shown in the embodiment of FIG. 3, the processor 314 can execute instructions to read a count, e.g., "m", on the counter 312 after a particular period of time. As the reader will appreciate, with the number of second gates 306 forming an oscillator, the count "m" measured after a particular period of time will be indicative of a frequency of the oscillator 306. The processor 314 can execute instructions to produce a ratio of the oscillator frequency ("osc.clk") to a frequency of a system clock ("sys.clk") illustrated in the timing diagram of FIG. 3B. That is, by allowing the oscillator 306 circuit to only run for a fixed number of system clocks and then allowing the processor 314 to read how many time the oscillator caused the counter to be incremented, a ratio of oscillator to system frequency can be determined. As the reader will appreciate, the chain of gates 306 will have to be long enough so that the frequency of the output 310 is not too high for the counter 312.

As with the embodiment of FIG. 2, the chain of gates 306 can include gates which are inverters, buffers, exclusive OR (xors) type gates, etc., and can have varying drive strengths. In various embodiments, it may be helpful to have several different oscillators which are used with a multiplexer (not shown) to select the output 310 from one of the oscillators 306. As the reader will appreciate, a disable signal for each oscillator 306 can be used to cause the chain of gates to be non-inverting and stop the free running oscillation. The disable signal for each oscillator 306 can be used to enable the oscillator for a particular number of system clocks and can be programmable if desired.

As shown in the embodiment of FIG. 3A, the processor 314 can execute instructions to compare the ratio to a look up table in a memory 316 to determine a performance speed of the ASIC. As discussed in connection with the embodiment of FIG. 2, the processor 314 can execute instructions to identify and/or to determine operating environmental conditions (e.g., retrieve ASIC temperature from a thermal diode located on the ASIC and/or retrieve ASIC operating voltage from a voltage analog to digital (A/D) converter located on the ASIC) while the ASIC is in a particular field of ASIC use, during debug, and/or other point in the ASIC lifecycle. This information can be used to fine tune the look up table in memory as the same has been described in connection with FIG. 2. In some embodiments, the processor 314 can execute instructions to identify and/or to determine process information, e.g., fabrication chip lots, etc., in association with the results obtained from the test circuit. Also, as with the embodiment of FIG. 2, the processor 314 can execute instructions to adjust or tune parameters for improved performance and/or error tolerance such as by adjusting a clock speed of the ASIC in relation to the performance speed and the identified environment/process information. The information, received and analyzed as described herein, can also be used to sort parts in a manufacturing stage, etc.

As the reader will appreciate, one advantage of FIG. 3's embodiment is that only the oscillators 306 involve careful layout. The output 310 of the oscillator 306 can be buffered. The counter 312 and possible multiplexer implementation can be less carefully laid out since they will not have a significant impact on loading. If several different gates types are desired to be included the "speed" measurement, the effort to implement the circuit embodiment of FIG. 3 could be less and the circuit size smaller.

FIG. 3B provides an illustrative comparison of the timing charts of a system clock ("sys.clk") 320, an enable signal (e.g., active for a number of system clocks) 322, an oscillator clock ("osc.clk") and counter reading for a fast ASIC part 324 scenario, and an osc.clk and counter reading for a slow ASIC part 326 scenario.

Similar to the discussion of FIG. 2, the chain of gates used to form the oscillator 306 can include gates of a particular type that are used in other circuit paths on the ASIC. Thus, as in the example of mentioned with FIG. 2, if particular circuit paths on the ASIC used eight input multiplexers, then the chain of gates 306 could include eight input multiplexers to retrieve information relevant to the actual gates used in the ASIC design. Additionally, in some embodiments, different chains of gates can be used to form a number of different oscillators and included in the test circuit. Each oscillator 306 could be read independently to provide an added level of detail, e.g. to measure the performance associated with particular portions, particular inputs, and/or particular gate types on the ASIC. Thus, the test circuit embodiments described herein, can provide a speed performance measurement, e.g., average delay indication or delay measurement, relevant to a particular gate type on the ASIC. For example, one chain of gates can be used to form an oscillator 306 which is used to measure speed performance associated with inverters, another for two input AND gate types, another for two input OR gate types, etc.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the invention. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the invention includes any other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. An application specific integrated circuit (ASIC), comprising:
   a processor on the ASIC;
   a memory coupled to the processor; and
   a test circuit integrated on the ASIC and coupled to the processor to perform testing internal to the ASIC, the test circuit having a clock input and an input to receive signals from the processor and where the processor can read an output of the test circuit to determine how far a transition initiated by the processor has propagated through the test circuit in a particular period of time.

2. The ASIC of claim 1, wherein a processor can execute instructions to read the address and can execute to compare the address to a look up table in a memory to determine a performance speed of the ASIC.

3. The ASIC of claim 2, wherein the ASIC includes program instructions storable in the memory and executable by the processor to adjust ASIC operation based on how far the transition propagated through the test circuit in the particular period of time.

4. The ASIC of claim 1, wherein the ASIC includes a thermal diode and wherein the processor can read environmental information for the environment in which the ASIC is being used including a temperature from the thermal diode.

5. The ASIC of claim 1, wherein the ASIC includes a voltage analog to digital (A/D) converter and wherein the processor can read environmental information for the environment in which the ASIC is being used including an operating voltage from the voltage A/D converter.

6. The ASIC of claim 1, wherein the processor can execute instructions to gather process information associated with chip manufacturing lots and can execute instructions to analyze the process information in association with information received from the test circuit in order to sort ASIC performance according to chip manufacturing lots.

7. The ASIC of claim 1, wherein the test circuit includes:
   a first flip flop having inputs to receive processor signals and clock signals, wherein the processor can provide a first signal to the first flip flop to initiate a transition on an output of the first flip flop in combination with a clock signal;
   a number of gates connected in series to receive the transition from the output of the first flip flop;
   a number of second flip flops, wherein each one of the number of second flip flops has an input connected to a different point along a signal path of the number of gates connected in series and has an input to receive clock signals;
   a logic circuit having a number of inputs, wherein each input is respectively coupled to receive a signal output from one of the number of second flip flops and encode an address indicative of how far the transition propagated through the number of gates in a particular period of time; and
   wherein the logic circuit can communicate the address to the processor.

8. The ASIC of claim 1, wherein the test circuit includes:
   a first gate having a first input to receive an enable signal;
   a number of second gates connected in series to receive a signal from an output of the first gate, wherein the number of second gates provide an odd number of inversions to the signal received from the output of the first gate and provide a second input to the first gate;
   wherein an output of one of the number of second gates is coupled to a counter; and
   wherein the counter is coupled to the processor.

9. An application specific integrated circuit (ASIC), comprising:
   one or more inputs, one or more outputs and logic circuitry connected therebetween; and
   a test circuit internal to the ASIC and coupled to the one or more inputs, the internal test circuit including:
      a first flip flop having inputs to receive processor signals and clock signals from the one or more inputs, wherein a processor can provide a first signal to the first flip flop to initiate a transition on an output of the first flip flop in combination with a clock signal;
      a number of gates connected in series to receive the transition from the output of the first flip flop;
      a number of second flip flops, wherein each one of the number of second flip flops has an input connected to a different point along a signal path of the number of gates connected in series and has an input to receive clock signals;
      a logic circuit having a number of inputs, wherein each input is respectively coupled to receive a signal output from one of the number of second flip flops and encode an address indicative of how far the transition propagated through the number of gates in a particular period of time; and
      wherein the logic circuit can communicate the address to the processor.

10. The ASIC of claim 9, wherein the number of gates include gates of a particular type that are used in other circuit paths on the ASIC.

11. The ASIC of claim 9, wherein a processor can execute instructions to read the address and can execute to compare the address to a look up table in a memory to determine a performance speed of the ASIC.

12. The ASIC of claim 11, wherein the ASIC includes a number of test circuits internal to the ASIC, wherein different chains of the number of gates are included in each test circuit and can be read independently to measure a performance associated with particular portions, particular inputs, and particular gate types on the ASIC.

13. The ASIC of claim 9, wherein the number of gates are inverters.

14. The ASIC of claim 9, wherein the number of gates are buffers.

15. The ASIC of claim 9, wherein the number of gates are exclusive OR type gates.

16. A method for testing an application specific integrated circuit (ASIC) having a test circuit thereon, comprising:
    providing an enable signal to a first flip flop in the test circuit in combination with a first clock signal to initiate a transition on an output of the first flip flop;

passing the transition as an output signal from the first flip flop through a number of gates connected in series;

on a next clock signal, receiving a signal state from a number of different points along a signal path of the number of gates, wherein each of the number of different points is connected to a different one of a number of second flip flops;

passing the output of each of the number of second flip flops to a logic circuit, wherein the logic circuit has a number of inputs, wherein each input is respectively coupled to receive a signal output from one of the number of second flip flops;

wherein the logic circuit detects a last input having a particular signal state and encodes an address of the last input indicative of how far the transition propagated through the number of gates in a particular period of time; and communicating the address to a processor to determine a performance speed of the ASIC.

17. The method of claim 16, wherein the method includes executing instructions on the processor to read the address and to compare the address to a look up table in a memory.

18. The method of claim 16, wherein the method includes communicating the address to a processor located on the ASIC.

19. The method of claim 18, wherein the method includes providing the enable signal to the first flip flop from the processor located on the ASIC.

20. The method of claim 16, wherein the method includes identifying process information for the environment in which the ASIC is being used, the process information including a temperature, a clock speed, and power information.

21. The method of claim 20, wherein the method includes adjusting a clock speed of the ASIC in relation to the performance speed and the identified process information.

22. The method of claim 20, wherein the method includes increasing and decreasing an operating voltage of the ASIC in relation to the performance speed.

23. The method of claim 20, wherein the method includes adjusting a temperature of the ASIC using a variable fan in relation to the performance speed.

* * * * *